United States Patent [19]
Müller et al.

[11] 3,988,684
[45] Oct. 26, 1976

[54] VOLTAGE TRANSFORMER FOR AN INSULATED HIGH-VOLTAGE SWITCHING INSTALLATION CONTAINING SEVERAL CONDUCTORS

[75] Inventors: Willi Müller; Hans-Joachim Freygang, both of Berlin, Germany; Gabor Kovacs, Vienna, Austria

[73] Assignee: Siemens Aktiengesellschaft, Munich, Germany

[22] Filed: Mar. 12, 1974

[21] Appl. No.: 450,432

[30] Foreign Application Priority Data
Mar. 15, 1973 Germany.............................. 2313478

[52] U.S. Cl.................................. 323/93; 317/244; 317/256; 324/126
[51] Int. Cl.²......................................... G01R 15/06
[58] Field of Search .............. 174/11 BH; 317/12 R, 317/242, 244, 256, 12 B; 323/93; 324/126

[56] References Cited
UNITED STATES PATENTS

| 3,524,133 | 8/1970 | Arndt.............................. 324/126 X |
| 3,701,944 | 10/1972 | Amalric.............................. 324/126 |
| 3,723,846 | 3/1973 | Thompson...................... 317/244 X |
| 3,763,378 | 10/1973 | Muller.............................. 323/93 X |
| 3,835,353 | 9/1974 | Hermstein et al................ 323/93 X |

FOREIGN PATENTS OR APPLICATIONS

| 339,835 | 8/1921 | Germany............................ 324/126 |

*Primary Examiner*—A. D. Pellinen
*Attorney, Agent, or Firm*—Kenyon & Kenyon Reilly Carr & Chapin

[57] ABSTRACT

A voltage transformer for a fully insulated high-voltage installation containing several conductors includes a plurality of electrodes corresponding to respective ones of the conductors. The electrodes are disposed outside of the arrangement of the conductors in such a manner that each one of the electrodes is disposed directly adjacent a corresponding one of the conductors. Each of the electrodes and the conductor directly adjacent thereto conjointly define a high-voltage capacitor. A plurality of low-voltage capacitors are disposed outside of the region occupied by the electrodes and are connected to corresponding ones of the high-voltage capacitors so as to conjointly define therewith respective capacitive voltage dividers.

8 Claims, 3 Drawing Figures

VOLTAGE TRANSFORMER FOR AN INSULATED HIGH-VOLTAGE SWITCHING INSTALLATION CONTAINING SEVERAL CONDUCTORS

BACKGROUND OF THE INVENTION

The invention relates to a voltage transformer for a completely insulated high-voltage switching installation comprising several conductors.

In completely insulated high-voltage installations containing one high-voltage conductor, it is known, for example, from the publication *Smit-Mededelingen* 24 (1969), pages 223 to 232, to accomplish a voltage measurement by means of an arrangement which is attached in the form of an addition on the outside of the metal encapsulation of the completely insulated high-voltage switching installation. This addition contains a rod-shaped conductor, which is connected with the high-voltage conductor and forms the high-potential electrode of the high-potential capacitor of a capacitive divider. A measuring electrode representing the other electrode of the high-potential capacitor is formed by arranging a further cylindrical electrode surrounding the rod. The measuring electrode is connected with a capacitor arranged on the outside, which forms the low-potential capacitor. An amplifier, to which a resistor forming the load is connected, is connected to the low-potential capacitor.

If a voltage transformer of this construction were used in a completely insulated high-voltage switching installation comprising several conductors, there would be incurred a very considerable additional expenditure because one external addition would have to be provided at each conductor of the high-voltage switching installation for measuring the voltage. The additions to the high-voltage switching installation would also lead to greater space requirements.

SUMMARY OF THE INVENTION

It is an object of the invention to provide an improved voltage transformer for an insulated high-voltage switching installation containing several conductors. Subsidiary to this object, it is an object of the invention to provide such a transformer which can be produced cost-effectively without requiring additional space.

The above objects are realized in the voltage transformer according to the invention by arranging a number of electrodes corresponding to the number of conductors outside the conductor configuration in such a manner that always one electrode is adjacent to a conductor. Each electrode forms, together with the adjacent conductor, a high-potential capacitor of a capacitive divider, whose low-potential capacitor is arranged outside the electrodes.

In the voltage transformer according to the invention, no external additions at the completely insulated high-voltage switching installation are thus required to form high-potential capacitors; the electrodes can be arranged inside the high-voltage switching installation so that no lateral projections are required. A particular advantage afforded by the invention is that the conductors of the high-voltage switching installation can be arranged with the relatively close spacing also in the vicinity of the voltage transformer according to the invention, the spacing being determined by the construction of the installation and the voltages. In the voltage transformer according to the invention, an additional rod which must be brought out and which is connected with a corresponding one of the conductors of the high-voltage switching installation is not required for serving as the high-voltage electrode for a corresponding one of the high-potential capacitors because the conductors of the high-voltage switching installation themselves constitute the high-voltage electrodes of the high-potential capacitors.

To realize the voltage transformer according to the invention in a high-voltage switching installation having three phase conductors of a three-phase system, the conductors are advantageously arranged at equal distances from each other. Likewise, in a high-voltage switching installation comprising three phase conductors of a three-phase system, the three conductors are arranged at the same distance from each other. In these installations, the electrodes are arranged uniformly on a circle about the centroid of the conductor configuration. In a voltage transformer configured in this manner, if the three conductors are arranged in perfect symmetry and the three-phase system is symmetrical, the advantage is obtained that interference voltages which are superimposed upon each measuring voltage and which are produced by capacities existing between each electrode and the two conductors of the high-voltage switching installation not adjacent thereto cancel each other as far as the angle error is concerned and therefore affect the measuring voltage only with respect to magnitude. By suitably adjusting an amplifier connected to the low-potential capacitor connected to the corresponding voltage transformer capacitor, this magnitude error can be compensated without appreciable cost.

In the voltage transformer according to the invention, the electrodes are preferably conjointly surrounded by a reference electrode.

The reference electrode of the voltage transformer according to the invention need not be a separate electrode in in every case; if the completely insulated high-voltage switching installation is a switching installation with metal encapsulation, then the reference electrode can advantageously be formed by the metal encapsulation of the installation.

If it should develop that with a reference electrode formed by the metal encapsulation of a high-voltage switching installation, a degradation of the transformer ratio accuracy of the voltage transformer according to the invention is to be expected, then it is advantageous when the reference electrode is a separate part and is arranged insulated from the metal encapsulation by means of inserts of insulation. Such degradation can occur because of parasitic currents and voltages in the installation.

In the voltage transformer according to the invention, each electrode is provided with a lead, which is brought out through holes in the reference electrode and, if necessary, in the metal encapsulation. Such a configuration is, of course, necessary only if the completely insulated high-voltage switching installation, which is to be equipped with the voltage transformer according to the invention, is one with metal encapsulation. However, if the high-voltage switching installation has no metal encapsulation, the leads of the electrodes can be brought out laterally of the relatively narrow reference electrode.

Regardless of whether the high-voltage switching installation has metal encapsulation or not, the reference electrode can be grounded. This affords the advantage that if succeeding amplifiers are grounded to the same potential, unambiguous conditions are defined.

It was already pointed out above that a measuring voltage picked up by the voltage transformer according to the invention contains interference voltages which are produced by the fact that a capacitance exists not only between each electrode and the adjacent conductor, but also between this electrode and the other, non-adjacent conductors of the high-voltage switching installation. In the case where the arrangement of the conductors of the high-voltage switching installation is not exactly symmetrical, it is found that the magnitude and phase of the interference voltages contained in the measured voltages are different. Consequently, the interference voltages in the measured voltages cancel neither as to magnitude nor phase. A compensation arrangement is therefore required which, according to a further embodiment of the invention, provides that each electrode is connected with the input of a summing amplifier, and that to the input of each summing amplifier, the outputs of the other summing amplifiers are also connected. By means of simple adjustments at the input resistors of the summing amplifiers, suitable weighting of the individual voltages present at the inputs of the summing amplifiers can be achieved. The summing amplifiers are preferably operational amplifiers and a preamplifier preferably precedes each summing amplifier.

Although the invention is illustrated and described herein as a voltage transformer for an insulated high-voltage switching installation containing several conductors, it is nevertheless not intended to be limited to the details shown, since various modifications may be made therein within the scope and the range of the claims. The invention, however, together with additional objects and advantages will be best understood from the following description and in connection with the accompanying drawings.

DESCRIPTION OF THE PREFERRED EMBODIMENTS OF THE INVENTION

Figure 1:
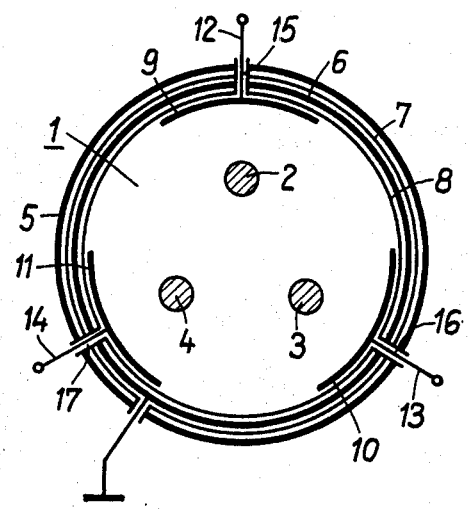
FIG. 1 is a schematic outline diagram of a section taken through a high-voltage switching installation having three conductors and equipped with a voltage transformer according to the invention.

In FIG. 1 is seen a completely insulated high-voltage switching installation 1 which includes three conductors 2, 3 and 4. The conductors 2, 3 and 4 are located in a metal encapsulation 5. The metal encapsulation 5 is sealed with respect to the outside everywhere and is filled on the inside, for instance, with an insulating gas.

Within the metal encapsulation 5, a reference electrode 6 is arranged which is insulated from the metal encapsulation 5 by inserts of insulation 7. On its side facing the conductors 2, 3 and 4, the reference electrode 6 is provided with a further insulating insert 8, on which the electrodes 9, 10 and 11 are placed. The reference electrode 6 is configured to have the form of a circular cylinder. The electrodes 9, 10 and 11 are formed like the reference electrode 6 and therefore form, in the embodiment shown, sections of a circular cylinder. The electrodes 9, 10 and 11 are each provided with a lead 12, 13 and 14, respectively, which are brought out in an insulated manner through holes 15, 16 and 17 in the reference electrode 6 and the metal encapsulation 5.

Figure 2:
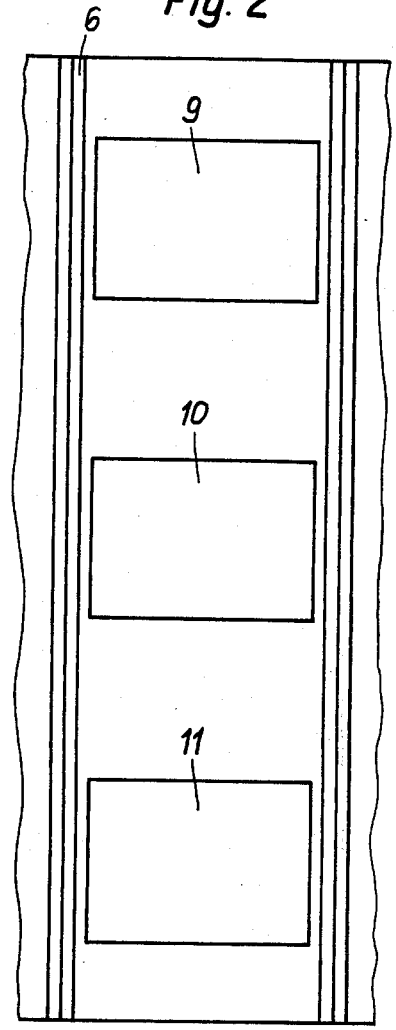
FIG. 2 is a development of the high-voltage switching installation at the region of the voltage transformer.

As may be seen from the development of the high-voltage switching installation in the region of the voltage transformer shown in FIG. 2, the electrodes 9, 10 and 11 extend over a relatively short length of the completely insulated high-voltage switching installation 1. The reference electrode 6 extends somewhat longer in the lengthwise direction of the installation than the electrodes 9, 10 and 11.

In the voltage transformer according to the invention, each conductor 2 to 4 of the completely insulated high-voltage switching installation 1 forms with the respective adjacent electrode 9 to 11 the high-potential capacitor of a capacitive voltage divider, whose low-potential capacitor is not shown in FIGS. 1 and 2. In addition, further capacities develop between the electrode 9 and the conductors 3 and 4, the electrode 10 and the conductors 2 and 4, and the electrode 11 and the conductors 2 and 3, which produce the result that the measured voltages taken off through the leads 12, 13 and 14 correspond not only to the respective voltage at the conductors 2, 3 and 4, but also contain interference voltages which are picked up by these supplementary capacities. These interference voltages falsify the measurement result, unless special steps are taken if the voltage transformer is not built perfectly symmetrical and the three-phase operation is symmetrical.

Figure 3:
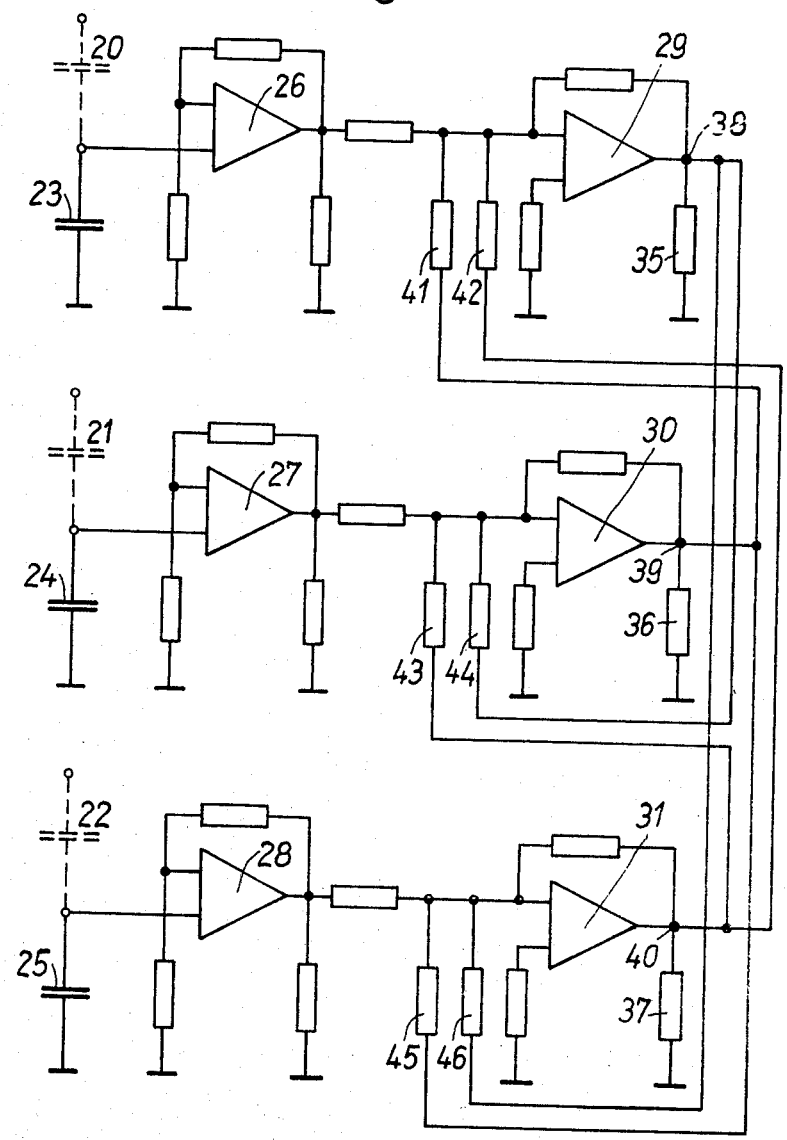
FIG. 3 illustrates the voltage transformer equipped with a circuit arrangement to compensate for interference voltages according to a subsidiary embodiment of the invention.

FIG. 3 shows a circuit arrangement by means of which it is possible to eliminate the influence of interference voltages.

Referring now to FIG. 3, capacitors 20, 21 and 22 are shown by broken lines and are equivalent circuits. The capacitors 20 to 22 represent the capacities which result between the electrodes and the conductors of the high-voltage switching installation. To each of the capacitors 20 to 22, a low-potential capacitor 23, 24 and 25 is connected to form a capacitive divider. The low-potential capacitors 23 to 25 are connected through respective preamplifiers formed by operational amplifiers 26, 27 and 28 to summing amplifiers 29, 30 and 31, respectively, which are formed by an appropriately connected operational amplifier. Resistors 35, 36 and 37 connected to the output of the summing amplifiers 29 to 31, respectively, constitute the loads customary in voltage transformers. This load can be, for instance, a measuring instrument or a system protection device.

The outputs 38, 39 and 40 of the summing amplifiers 29 to 31 each are connected with the inputs of the other summing amplifiers 29 to 31; specifically, the output 38 of the summing amplifier 29 is connected with the input of the summing amplifier 30 as well as with the input of the summing amplifier 31, the output 39 of the summing amplifier 30 with the input of the summing amplifier 31 and of the summing amplifier 29, and the output 40 of the summing amplifier 31 with the inputs of the summing amplifiers 29 and 30. By suitable adjustment of the input resistors 41 and 42 of the summing amplifier 29, the input resistors 43 and 44 of the summing amplifier 30 and the input resistors 45 and 46 of the summing amplifier 31, the voltages at the loads 35 to 37 of the summing amplifiers 29 to 31 can be made to correspond to the voltages of each conductor of the high-voltage switching installation with respect to ground. The influence of the interference voltages on the measurement result is thereby eliminated.

A voltage transformer for a completely insulated switching installation having several conductors is described above which is of simple configuration and can therefore be produced at low cost. Further, the voltage transformer according to the invention does not require external additions to the high-voltage switching installation so that no additional space is required in the installation because of the voltage transformer.

What is claimed is:

1. A voltage transformer for a fully insulated high-voltage installation containing several conductors comprising: a plurality of electrodes corresponding to respective ones of the conductors, said electrodes being disposed outside of the arrangement of the conductors in such a manner that each one of said electrodes is disposed adjacent a corresponding one of the conductors, each of said electrodes and the conductor adjacent thereto conjointly defining a high-voltage capacitor; a plurality of low-voltage capacitors disposed outside of the region occupied by said electrodes, said low-voltage capacitors being connected to corresponding ones of said electrodes so as to cause corresponding ones of said high-voltage capacitors and said low-voltage capacitors to conjointly define respective capacitive voltage dividers; a plurality of summing amplifiers corresponding to respective ones of said electrodes, each of said summing amplifiers having an input for connecting the corresponding electrode thereto, the outputs of each one of said summing amplifiers being connected, respectively, to the inputs of the remaining ones of said summing amplifiers.

2. The voltage transformer of claim 1, the conductors of the high-voltage installation being three in number and being the phase conductors of a three-phase system, the three conductors being arranged so as to be equidistant from each other, said electrodes being arranged uniformly on a circle having a center corresponding to the centroid of the three conductors.

3. The voltage transformer of claim 1 comprising a reference electrode disposed in surrounding relation to said electrodes.

4. The voltage transformer of claim 3 wherein the high-voltage installation includes a metal encapsulation, said reference electrode being said metal encapsulation.

5. The voltage transformer of claim 3, said reference electrode having a plurality of holes corresponding to respective ones of the electrodes of said plurality of electrodes, and a plurality of connecting leads connected to corresponding ones of the electrodes of said plurality of electrodes, said connecting leads being arranged so as to extend out through corresponding ones of said holes in an insulated manner.

6. The voltage transformer of claim 3 wherein the said high-voltage installation includes a metal encapsulation, said reference electrode and the encapsulation each having a plurality of holes corresponding to respective ones of the electrodes of said plurality of electrodes, and a plurality of connecting leads connected to corresponding ones of the electrodes of said plurality of electrodes, said connecting leads being arranged so as to extend out in an insulated manner through corresponding ones of said holes of said reference electrode and of the metal encapsulation.

7. The voltage transformer of claim 1 comprising a plurality of preamplifiers, said preamplifiers being connected ahead of corresponding ones of said summing amplifiers.

8. A voltage transformer for a fully insulated high-voltage, metal-encapsulated installation containing several conductors comprising: a plurality of electrodes corresponding to respective ones of the conductors, said electrodes being disposed outside of the arrangement of the conductors in such a manner that each one of said electrodes is disposed adjacent a corresponding one of the conductors, each of said electrodes and the conductor adjacent thereto conjointly defining a high-voltage capacitor; and a plurality of low-voltage capacitors disposed outside of the region occupied by said electrodes, said low-voltage capacitors being connected to a corresponding one of said high-voltage capacitors so as to conjointly define therewith respective capacitive voltage dividers, a reference electrode disposed in surrounding relation to said electrodes, and insulation insert means for insulating said reference electrode from the metal encapsulation.

* * * * *